(12) United States Patent
Hong

(10) Patent No.: US 11,575,375 B2
(45) Date of Patent: Feb. 7, 2023

(54) ELECTRONIC DEVICE PERFORMING POWER GATING OPERATION

(71) Applicant: SK hynix Inc., Icheon-si Gyeonggi-do (KR)

(72) Inventor: Yun Seok Hong, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/499,476

(22) Filed: Oct. 12, 2021

(65) Prior Publication Data

US 2022/0407510 A1    Dec. 22, 2022

(30) Foreign Application Priority Data

Jun. 21, 2021    (KR) .................. 10-2021-0080444

(51) Int. Cl.
*H03K 3/00* (2006.01)
*H03K 19/00* (2006.01)
*H03K 19/0175* (2006.01)
*H03K 19/0185* (2006.01)
*H03K 17/687* (2006.01)

(52) U.S. Cl.
CPC . *H03K 17/687* (2013.01); *H03K 2217/94042* (2013.01)

(58) Field of Classification Search
None
See application file for complete search history.

(56) References Cited

U.S. PATENT DOCUMENTS 9,762,231 B2    9/2017    Loke et al.
9,997,214 B1 *  6/2018    Kumar ................ G11C 7/1069

FOREIGN PATENT DOCUMENTS

KR    100935729 B1    1/2010

* cited by examiner

*Primary Examiner* — Kenneth B Wells
(74) *Attorney, Agent, or Firm* — William Park & Associates Ltd.

(57) ABSTRACT

An electronic device includes a driving control signal generation circuit configured to generate first and second driving control signals and a driving switching control signal. The electronic device also includes a switching control signal driving circuit configured to drive a switching control signal to a first voltage on the basis of the first driving control signal and the driving switching control signal or drive the switching control signal to a second voltage on the basis of the second driving control signal, depending on whether a power-down mode is performed.

19 Claims, 12 Drawing Sheets

FIG. 2

| | VOLTAGE LEVEL |
|---|---|
| VDD | 1.05 (V) |
| VINT | 0.8 (V) |
| VSS | 0 (V) |
| VNG | -0.2 (V) |

ELECTRONIC DEVICE PERFORMING POWER GATING OPERATION

CROSS-REFERENCE TO RELATED APPLICATION

The present application claims priority under 35 U.S.C. § 119(a) to Korean application number 10-2021-0080444, filed in the Korean Intellectual Property Office on Jun. 21, 2021, the entire disclosure of which is incorporated herein by reference.

BACKGROUND

1. Technical Field

The present disclosure relates to an electronic device which performs a power gating operation.

2. Related Art

A semiconductor device may perform a power gating operation for controlling whether to supply power to an internal circuit, so as to reduce unnecessary power consumption. In order for the semiconductor device to perform the power gating operation, a plurality of transistors which drive a signal for controlling the power gating operation are provided.

The degree of the degradation of a transistor, such as a time-dependent dielectric breakdown (TDDB) phenomenon and a bias temperature instability (BTI) phenomenon, may become serious with the lapse of time.

SUMMARY

Some embodiments of the present disclosure are directed to an electronic device which performs a power gating operation.

In an embodiment, an electronic device may include a driving control signal generation circuit configured to generate first and second driving control signals and a driving switching control signal. The electronic device may also include a switching control signal driving circuit configured to drive a switching control signal to a first voltage on the basis of the first driving control signal and the driving switching control signal or drive the switching control signal to a second voltage on the basis of the second driving control signal, depending on whether a power-down mode is performed. The first driving control signal and the driving switching control signal are driven to different levels when the power-down mode is performed.

In an embodiment, an electronic device may include a driving control signal generation circuit configured to generate first and second driving control signals and a driving switching control signal. The electronic device may also include a switching control signal driving circuit configured to drive a switching control signal to a first voltage on the basis of the first driving control signal and the driving switching control signal or drive the switching control signal to a second voltage on the basis of the second driving control signal and the driving switching control signal, depending on whether a power-down mode is performed. The first driving control signal and the driving switching control signal are driven to different levels when the power-down mode is performed.

In an embodiment, an electronic device may include a first driving control signal generation circuit configured to generate a first driving control signal and a first driving switching control signal. The electronic device may also include a second driving control signal generation circuit configured to generate a second driving control signal. The electronic device may further include a switching control signal driving circuit configured to drive a switching control signal to a first voltage on the basis of the first driving control signal and the first driving switching control signal or drive the switching control signal to a ground voltage on the basis of the second driving control signal and the first driving switching control signal, depending on whether a power-down mode is entered. The first driving control signal and the first driving switching control signal are driven to different levels when the power-down mode is performed.

According to an embodiment of the present disclosure, when a switching control signal for a power gating operation is pull-down driven, levels of control signals which control whether to turn on a pull-up driving element and a pull-up switching element are set differently, which may make it possible to alleviate the degradation of the pull-up driving element and the pull-up switching element.

In addition, according to an embodiment of the present disclosure, when the switching control signal for the power gating operation is pull-up driven, levels of control signals which control whether to turn on a pull-down driving element and a pull-down switching element are set differently, which may make it possible to alleviate the degradation of the pull-down driving element and the pull-down switching element.

BRIEF DESCRIPTION OF THE DRAWINGS

FIG. 2 is a table to assist in the description of levels of voltages applied to a switching control signal generation circuit illustrated in FIG. 1.

DETAILED DESCRIPTION

In the following descriptions of examples, the term "preset" indicates that the numerical value of a parameter is previously decided, when the parameter is used in a process or algorithm. According to an example, the numerical value of the parameter may be set when the process or algorithm is started or during a period in which the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through still another component interposed therebetween. On the other hand, when one component is referred to as being "directly coupled" or "directly connected" to another component, it should be understood that the components are directly coupled or connected to each other without still another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an example, a "logic high level" may be set to a voltage higher than a "logic low level." According to an example, the logic levels of signals may be set to different logic levels or opposite logic levels. For example, a signal having a logic high level may be set to have a logic low level according to an example, and a signal having a logic low level may be set to have a logic high level according to an example.

Hereafter, the teachings of the present disclosure will be described in more detail through examples. These examples are only used to exemplify the teachings of the present disclosure, and the scope of the present disclosure is not limited by these examples.

Figure 1:
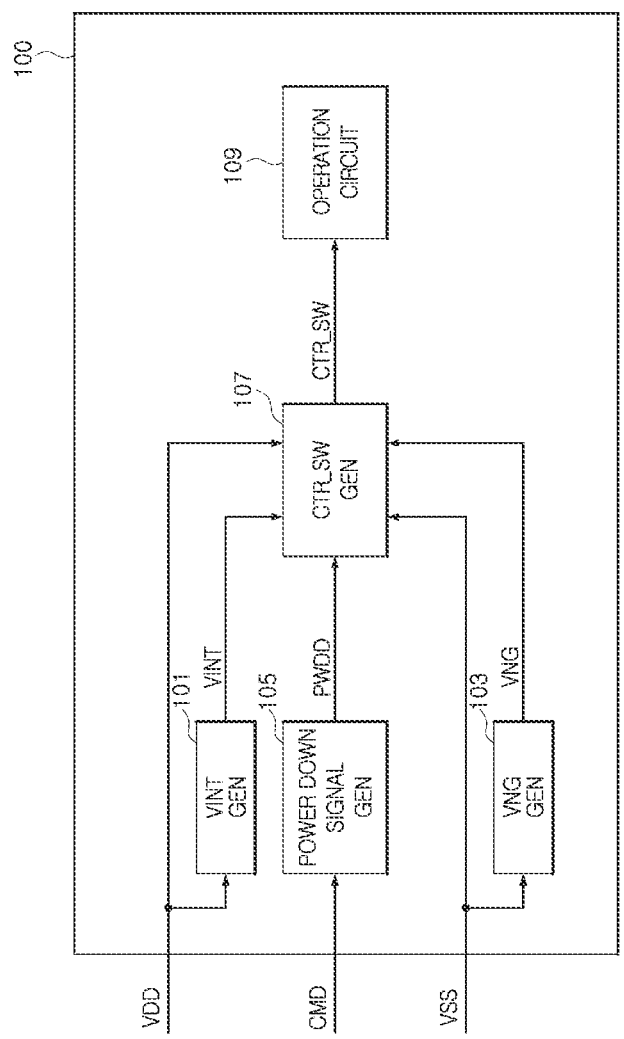
FIG. 1 is a block diagram illustrating a configuration of an electronic device in accordance with an example of the present disclosure.

FIG. 1 is a block diagram illustrating a configuration of an electronic device 100 in accordance with an example of the present disclosure. As illustrated in FIG. 1, the electronic device 100 may include an internal voltage generation circuit (VINT GEN) 101, a bias voltage generation circuit (VNG GEN) 103, a power-down signal generation circuit (POWER DOWN SIGNAL GEN) 105, a switching control signal generation circuit (CTR_SW GEN) 107 and an internal operation circuit (OPERATION CIRCUIT) 109. The electronic device 100 may be implemented using a semiconductor device. The electronic device 100 may be supplied with a power supply voltage VDD and a ground voltage VSS from power pads (not illustrated). The electronic device 100 may perform various internal operations including a power-down mode by being supplied with a command CMD from outside the electronic device 100. The number of bits of the command CMD may be variously set depending on an embodiment.

The internal voltage generation circuit 101 may generate an internal voltage VINT by being supplied with the power supply voltage VDD. The power supply voltage VDD and the internal voltage VINT may be set as positive voltages. The internal voltage generation circuit 101 may generate the internal voltage VINT by adjusting a level of the power supply voltage VDD. In more detail, the internal voltage generation circuit 101 may set a level of the internal voltage VINT by lowering the level of the power supply voltage VDD. That is to say, the internal voltage VINT may be set to a level lower than the level of the power supply voltage VDD. For example, the internal voltage generation circuit 101 may generate the internal voltage VINT having a level of 0.8(V) from the power supply voltage VDD having a level of 1.05(V).

The bias voltage generation circuit 103 may generate a bias voltage VNG by being supplied with the ground voltage VSS. A level of the ground voltage VSS may be set to 0(V). The bias voltage VNG may be set as a negative voltage. The bias voltage generation circuit 103 may set a level of the bias voltage VNG by adjusting the level of the ground voltage VSS. For example, the bias voltage generation circuit 103 may generate the bias voltage VNG having a level of −0.2(V) from the ground voltage VSS having a level of 0(V).

The power-down signal generation circuit 105 may generate a power-down period signal PWDD on the basis of the command CMD. The power-down signal generation circuit 105 may activate the power-down period signal PWDD by decoding the command CMD having a combination for performing the power-down mode. The power-down signal generation circuit 105 may deactivate the power-down period signal PWDD by decoding the command CMD having a combination for ending the power-down mode. The power-down period signal PWDD may be activated during a period in which the power-down mode is performed. The power-down mode may be set as a mode for cutting off power supplied to the internal operation circuit 109. The power-down period signal PWDD may be deactivated during a period in which a normal mode is performed. The normal mode may be set as a mode for supplying power to the internal operation circuit 109.

The switching control signal generation circuit 107 may generate a switching control signal CTR_SW by being supplied with the power supply voltage VDD, the internal voltage VINT, the ground voltage VSS and the bias voltage VNG on the basis of the power-down period signal PWDD. The switching control signal generation circuit 107 may drive the switching control signal CTR_SW to the bias voltage VNG during a period in which the power-down period signal PWDD is activated. The switching control signal generation circuit 107 may drive the switching control signal CTR_SW to the power supply voltage VDD during a period in which the power-down period signal PWDD is deactivated. A detailed configuration and operation of the switching control signal generation circuit 107 will be described later with reference to FIG. 3.

The internal operation circuit 109 may perform various internal operations on the basis of the switching control signal CTR_SW. When the switching control signal CTR_SW is driven to the bias voltage VNG, the internal operation circuit 109 may enter the power-down mode, and thus, the supply of power to the internal operation circuit 109 may be cut off. When the switching control signal CTR_SW is driven to the power supply voltage VDD, the internal operation circuit 109 may enter the normal mode, and thus, may perform various internal operations by being supplied with power. A detailed configuration and operation of the internal operation circuit 109 will be described later with reference to FIG. 4.

FIG. 2 is a table to assist in the description of levels of voltages applied to the switching control signal generation circuit 107 illustrated in FIG. 1. Referring to FIG. 2, a level of the power supply voltage VDD may be set to 1.05(V). A level of the internal voltage VINT may be set to 0.8(V), which is lower than the level of the power supply voltage VDD. A level of the ground voltage VSS may be set to 0(V). A level of the bias voltage VNG may be set to −0.2(V) as a negative voltage.

Figure 3:
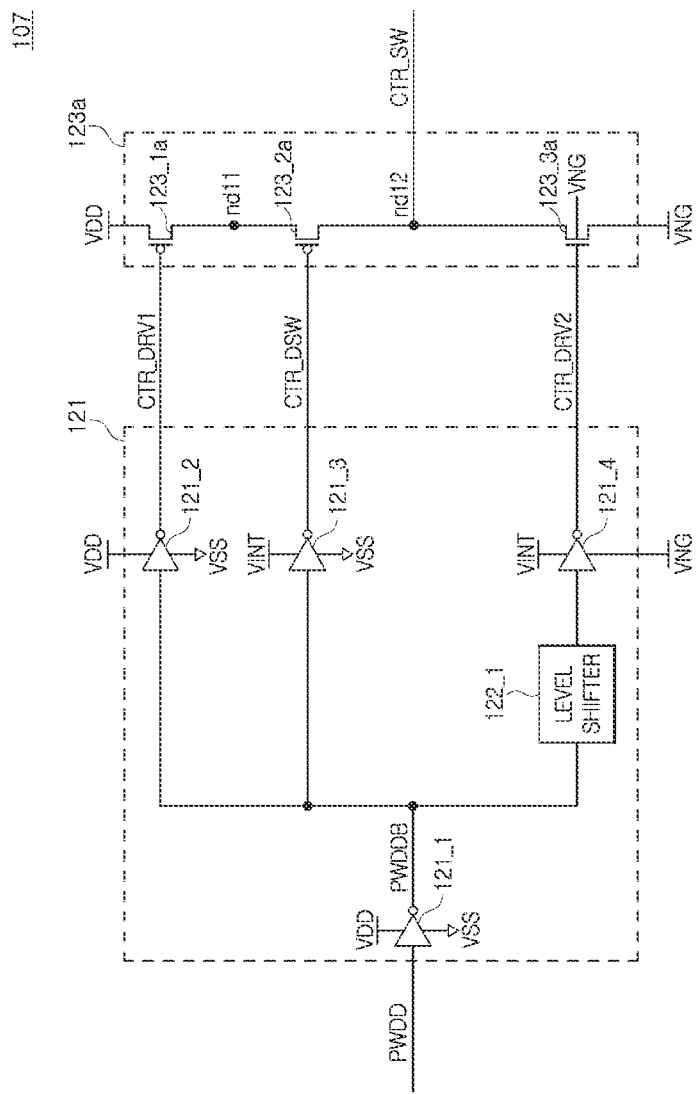
FIG. 3 is a diagram illustrating an example of the switching control signal generation circuit illustrated in FIG. 1.

FIG. 3 is a diagram illustrating an example of the switching control signal generation circuit 107 illustrated in FIG. 1. As illustrated in FIG. 3, the switching control signal generation circuit 107 may include a driving control signal generation circuit 121 and a switching control signal driving circuit 123a.

The driving control signal generation circuit 121 may include first, second, third and fourth driving circuits 121_1, 121_2, 121_3 and 121_4 and a level shifter 122_1. The driving control signal generation circuit 121 may generate a first driving control signal CTR_DRV1, a driving switching control signal CTR_DSW and a second driving control signal CTR_DRV2 by being supplied with the power supply voltage VDD, the internal voltage VINT, the ground voltage VSS and the bias voltage VNG on the basis of the power-down period signal PWDD.

When the power-down mode is performed, the driving control signal generation circuit 121 may drive the first driving control signal CTR_DRV1 to the power supply voltage VDD and drive the driving switching control signal CTR_DSW and the second driving control signal CTR_DRV2 to the internal voltage VINT. In other words, when the power-down mode is performed, the driving control signal generation circuit 121 may drive the first driving control signal CTR_DRV1 and the driving switching control signal CTR_DSW to different levels.

When the power-down mode is ended, the driving control signal generation circuit 121 may drive the first driving control signal CTR_DRV1 and the driving switching control signal CTR_DSW to the ground voltage VSS and drive the second driving control signal CTR_DRV2 to the bias voltage VNG. In other words, when the power-down mode is ended, the driving control signal generation circuit 121 may drive the second driving control signal CTR_DRV2 and the driving switching control signal CTR_DSW to different levels.

The first driving circuit 121_1 may receive the power-down period signal PWDD and drive an inverted power-down period signal PWDDB to one of the power supply voltage VDD and the ground voltage VSS. When the power-down mode is performed, the first driving circuit 121_1 may drive the inverted power-down period signal PWDDB to the ground voltage VSS on the basis of the activated power-down period signal PWDD. When the power-down mode is ended, the first driving circuit 121_1 may drive the inverted power-down period signal PWDDB to the power supply voltage VDD on the basis of the deactivated power-down period signal PWDD. The first driving circuit 121_1 may be implemented using an inverter.

The second driving circuit 121_2 may receive the inverted power-down period signal PWDDB and drive the first driving control signal CTR_DRV1 to one of the power supply voltage VDD and the ground voltage VSS. When the power-down mode is performed, the second driving circuit 121_2 may drive the first driving control signal CTR_DRV1 to the power supply voltage VDD. When the power-down mode is ended, the second driving circuit 121_2 may drive the first driving control signal CTR_DRV1 to the ground voltage VSS. The second driving circuit 121_2 may be implemented using an inverter.

The third driving circuit 121_3 may receive the inverted power-down period signal PWDDB and drive the driving switching control signal CTR_DSW to one of the internal voltage VINT and the ground voltage VSS. When the power-down mode is performed, the third driving circuit 121_3 may drive the driving switching control signal CTR_DSW to the internal voltage VINT. When the power-down mode is ended, the third driving circuit 121_3 may drive the driving switching control signal CTR_DSW to the ground voltage VSS. The third driving circuit 121_3 may be implemented using an inverter.

The level shifter 122_1 may shift a level of the inverted power-down period signal PWDDB. For example, the level shifter 122_1 may lower a level of the inverted power-down period signal PWDDB by 0.2(V) and output an output signal to an input terminal of the fourth driving circuit 121_4.

The fourth driving circuit 121_4 may receive the output signal of the level shifter 122_1 and drive the second driving control signal CTR_DRV2 to one of the internal voltage VINT and the bias voltage VNG. When the power-down mode is performed, the fourth driving circuit 121_4 may drive the second driving control signal CTR_DRV2 to the internal voltage VINT. When the power-down mode is ended, the fourth driving circuit 121_4 may drive the second driving control signal CTR_DRV2 to the bias voltage VNG. The fourth driving circuit 121_4 may be implemented using an inverter.

The switching control signal driving circuit 123a may drive the switching control signal CTR_SW by being supplied with the power supply voltage VDD and the bias voltage VNG on the basis of the first driving control signal CTR_DRV1, the second driving control signal CTR_DRV2 and the driving switching control signal CTR_DSW. The switching control signal driving circuit 123a may include a first driving element 123_1a, a driving switching element 123_2a and a second driving element 123_3a. Each of the first driving element 123_1a and the driving switching element 123_2a may be implemented using a PMOS transistor having a gate oxide layer which is formed thin, in order to quickly enter the normal mode when the power-down mode is ended. The second driving element 123_3a may be implemented using an NMOS transistor having a gate oxide layer which is formed thick, in order to alleviate the degradation of a transistor. The degradation of a transistor may become serious as a voltage difference between a gate terminal and a drain terminal of the transistor increases. According to an embodiment, the gate oxide layer of the second driving element 123_3a may be formed thicker than that of each of the first driving element 123_1a and the driving switching element 123_2a. When being turned on on the basis of the first driving control signal CTR_DRV1, the first driving element 123_1a may drive an internal node nd11 by being supplied with the power supply voltage VDD. When being turned on on the basis of the driving switching control signal CTR_DSW, the driving switching element 123_2a may electrically couple the internal node nd11 and an output node nd12 through which the switching control signal CTR_SW is outputted. When being turned on on the basis of the second driving control signal CTR_DRV2, the second driving element 123_3a may drive the output node nd12 by being supplied with the bias voltage VNG. A body of the second driving element 123_3a may be supplied with the bias voltage VNG.

Depending on whether the power-down mode is performed, the switching control signal driving circuit 123a may drive the switching control signal CTR_SW to the power supply voltage VDD by turning on the first driving element 123_1a and the driving switching element 123_2a, or may drive the switching control signal CTR_SW to the bias voltage VNG by turning on the second driving element 123_3a. When the power-down mode is performed, the switching control signal driving circuit 123a may drive the switching control signal CTR_SW to the bias voltage VNG by turning on the second driving element 123_3a on the basis of the second driving control signal CTR_DRV2. When the power-down mode is performed, the switching control signal driving circuit 123*a* may turn off the first driving element 123_1*a* and the driving switching element 123_2*a* on the basis of the first driving control signal CTR_DRV1 and the driving switching control signal CTR_DSW. When the power-down mode is ended, the switching control signal driving circuit 123*a* may drive the switching control signal CTR_SW to the power supply voltage VDD by turning on the first driving element 123_1*a* and the driving switching element 123_2*a* on the basis of the first driving control signal CTR_DRV1 and the driving switching control signal CTR_DSW. When the power-down mode is ended, the switching control signal driving circuit 123*a* may turn off the second driving element 123_3*a* on the basis of the second driving control signal CTR_DRV2.

Figure 4:
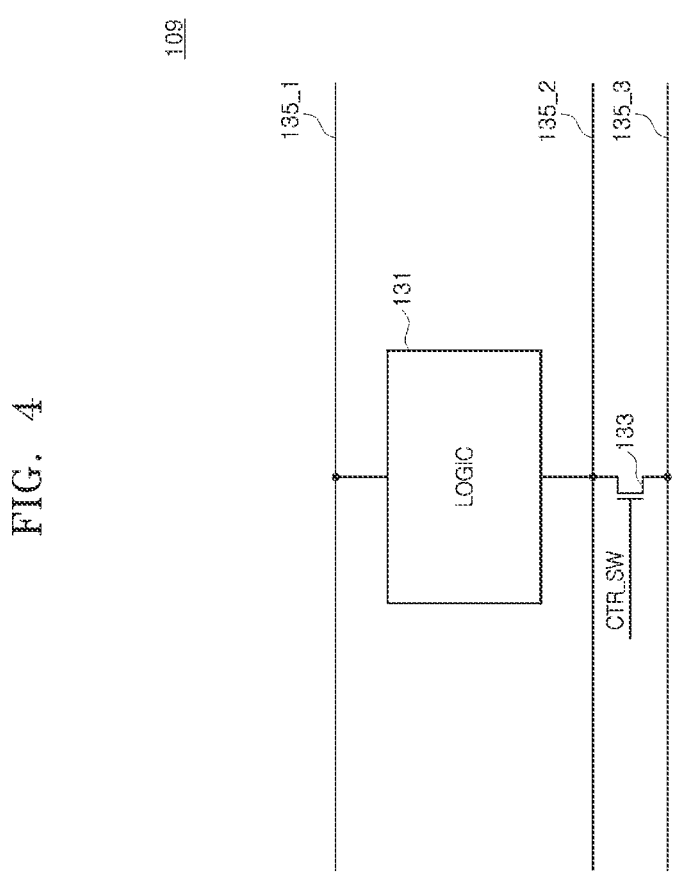
FIG. 4 is a diagram illustrating an example of an internal operation circuit illustrated in FIG. 1.

FIG. 4 is a diagram illustrating an example of the internal operation circuit 109 illustrated in FIG. 1. As illustrated in FIG. 4, the internal operation circuit 109 may include a logic circuit (LOGIC) 131 and a switching element 133.

The logic circuit 131 may be implemented using elements for performing various internal operations depending on an embodiment. The logic circuit 131 may be coupled between a power line 135_1 and a virtual ground line 135_2. The power line 135_1 may supply a positive voltage. For example, the power line 135_1 may be coupled to a terminal of the power supply voltage VDD (see FIG. 1). For another example, the power line 135_1 may supply the internal voltage VINT (see FIG. 1).

The switching element 133 may be implemented using an NMOS transistor. The switching element 133 may be coupled between the virtual ground line 135_2 and a ground line 135_3. The ground line 135_3 may be coupled to a terminal of the ground voltage VSS (see FIG. 1). The switching element 133 may control the supply of the ground voltage VSS to the logic circuit 131 on the basis of the switching control signal CTR_SW. When the power-down mode is performed, the switching element 133 may cut off the supply of the ground voltage VSS to the logic circuit 131 on the basis of the switching control signal CTR_SW driven to the bias voltage VNG (see FIG. 1). In the present example, when the power-down mode is performed, the switching element 133 may be supplied with the switching control signal CTR_SW driven to the bias voltage VNG having the level lower than the level of the ground voltage VSS (see FIG. 1), which makes it possible to reduce the leakage current of the logic circuit 131 during a period in which the power-down mode is performed. When the power-down mode is ended, the switching element 133 may supply the ground voltage VSS to the logic circuit 131 on the basis of the switching control signal CTR_SW driven to the power supply voltage VDD (see FIG. 1). In the present example, when the power-down mode is ended, the switching element 133 may be supplied with the switching control signal CTR_SW driven to the power supply voltage VDD having the level higher than the level of the internal voltage VINT, which makes it possible to smoothly supply power to the logic circuit 131 during a period in which the normal mode is performed.

Figure 5:
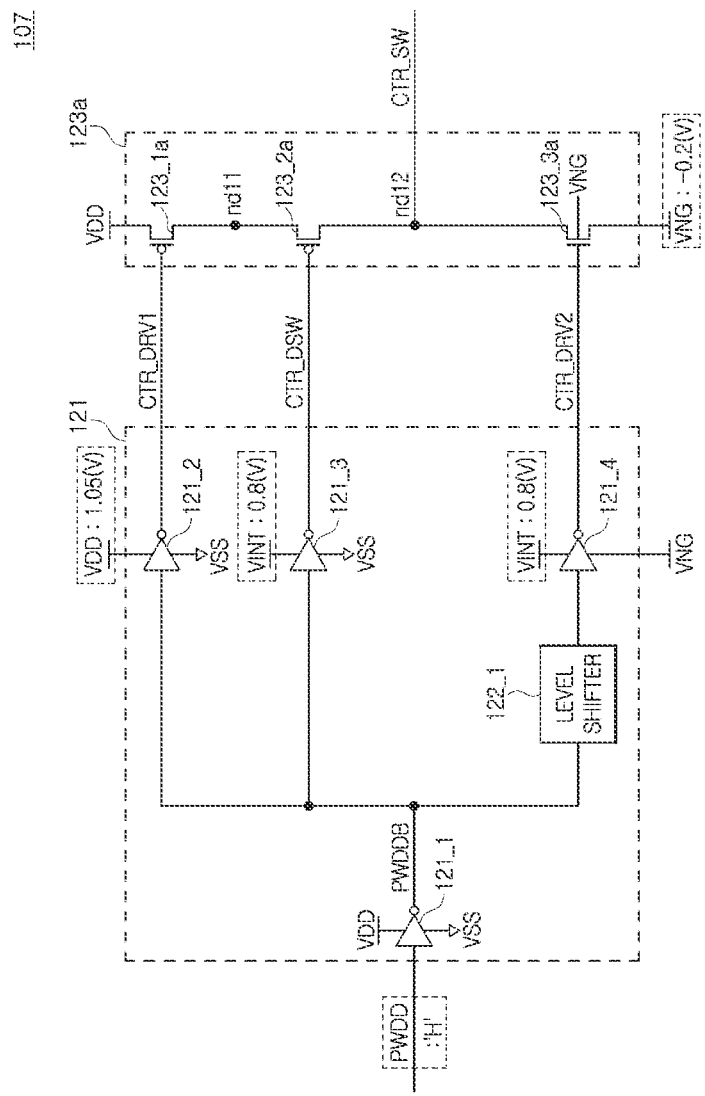
FIGS. 5 and 6 are diagrams to assist in the description of the operation of the switching control signal generation circuit illustrated in FIG. 3.

FIG. 5 is a diagram to assist in the description of an operation performed in the switching control signal generation circuit 107 illustrated in FIG. 3 when the power-down mode is performed. Referring to FIG. 2, the power supply voltage VDD, the internal voltage VINT, and the bias voltage VNG illustrated in FIG. 5 may be set to levels of 1.05(V), 0.8(V) and −0.2(V), respectively.

When the power-down mode is performed, the driving control signal generation circuit 121 may drive the first driving control signal CTR_DRV1, the driving switching control signal CTR_DSW, and the second driving control signal CTR_DRV2 to 1.05(V), 0.8(V), and 0.8(V), respectively, on the basis of the power-down period signal PWDD having a logic high level 'H.'

When the power-down mode is performed, the second driving element 123_3*a* may be turned on on the basis of the second driving control signal CTR_DRV2 driven to 0.8(V) and drive the output node nd12 to −0.2(V).

When the power-down mode is performed, the first driving element 123_1*a* may be turned off on the basis of the first driving control signal CTR_DRV1 driven to 1.05(V). As the first driving element 123_1*a* is separated from the output node nd12, driven to −0.2(V), by the driving switching element 123_2*a*, the degradation of the first driving element 123_1*a* may be alleviated (the degradation of a transistor may become serious as a voltage difference between a gate terminal and a drain terminal of the transistor increases).

Even though the output node nd12 is driven to −0.2(V), which is lower than 0(V), when the power-down mode is performed, as the driving switching element 123_2*a* is turned off on the basis of the driving switching control signal CTR_DSW driven to 0.8(V), which is lower than 1.05(V), the degradation of the driving switching element 123_2*a* may be alleviated.

Accordingly, in pull-down driving the switching control signal CTR_SW for a power gating operation when the power-down mode is performed, the switching control signal driving circuit 123*a* may be supplied with the first driving control signal CTR_DRV1 and the driving switching control signal CTR_DSW which are driven to different levels, which makes it possible to alleviate the degradation of the first driving element 123_1*a* and the driving switching element 123_2*a*.

Figure 6:
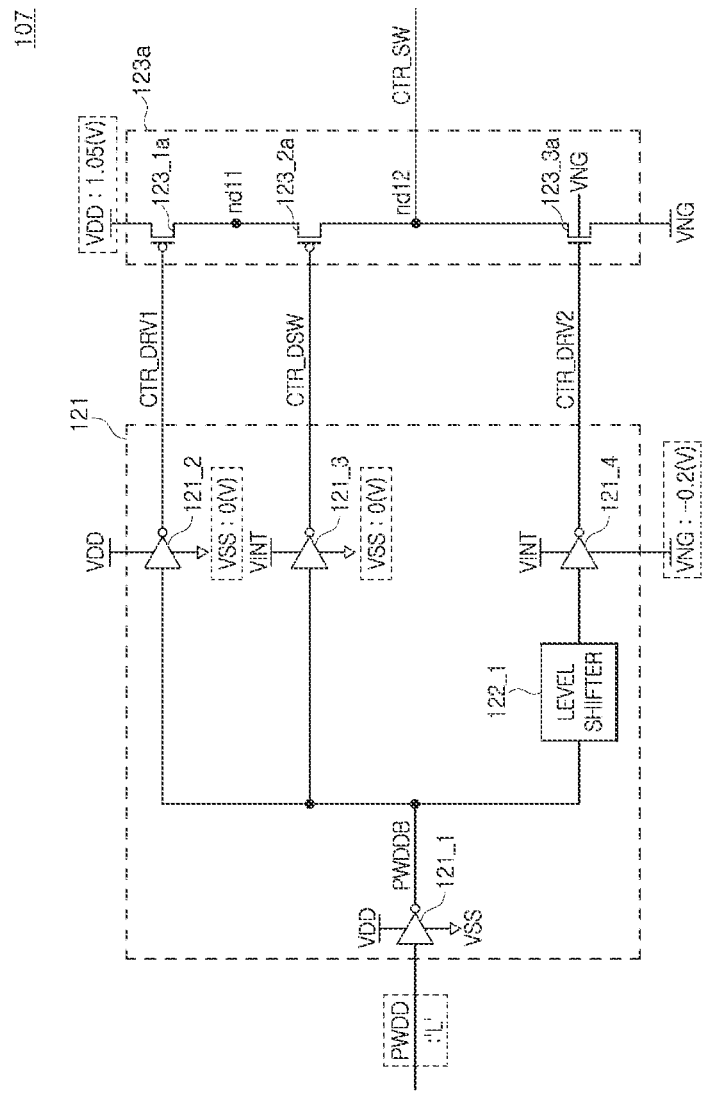

FIG. 6 is a diagram to assist in the description of an operation performed in the switching control signal generation circuit 107 illustrated in FIG. 3 when the power-down mode is ended. Referring to FIG. 2, the power supply voltage VDD, the ground voltage VSS, and the bias voltage VNG illustrated in FIG. 6 may be set to 1.05(V), 0(V), and −0.2(V), respectively.

When the power-down mode is ended, the driving control signal generation circuit 121 may drive the first driving control signal CTR_DRV1, the driving switching control signal CTR_DSW, and the second driving control signal CTR_DRV2 to 0(V), 0(V), and −0.2(V), respectively, on the basis of the power-down period signal PWDD having a logic low level 'L.'

When the power-down mode is ended, the first driving element 123_1*a* and the driving switching element 123_2*a* may be turned on on the basis of the first driving control signal CTR_DRV1 and the driving switching control signal CTR_DSW driven to 0(V) and drive the output node nd12 to 1.05(V).

When the power-down mode is ended, the second driving element 123_3*a* may be turned off on the basis of the second driving control signal CTR_DRV2 driven to −0.2(V). Even through the output node nd12 is driven to 1.05(V), which is higher than 0.8(V), because the gate oxide layer of the second driving element 123_3*a* is formed thick, the degradation of the second driving element 123_3*a* may be alleviated.

Figure 7:
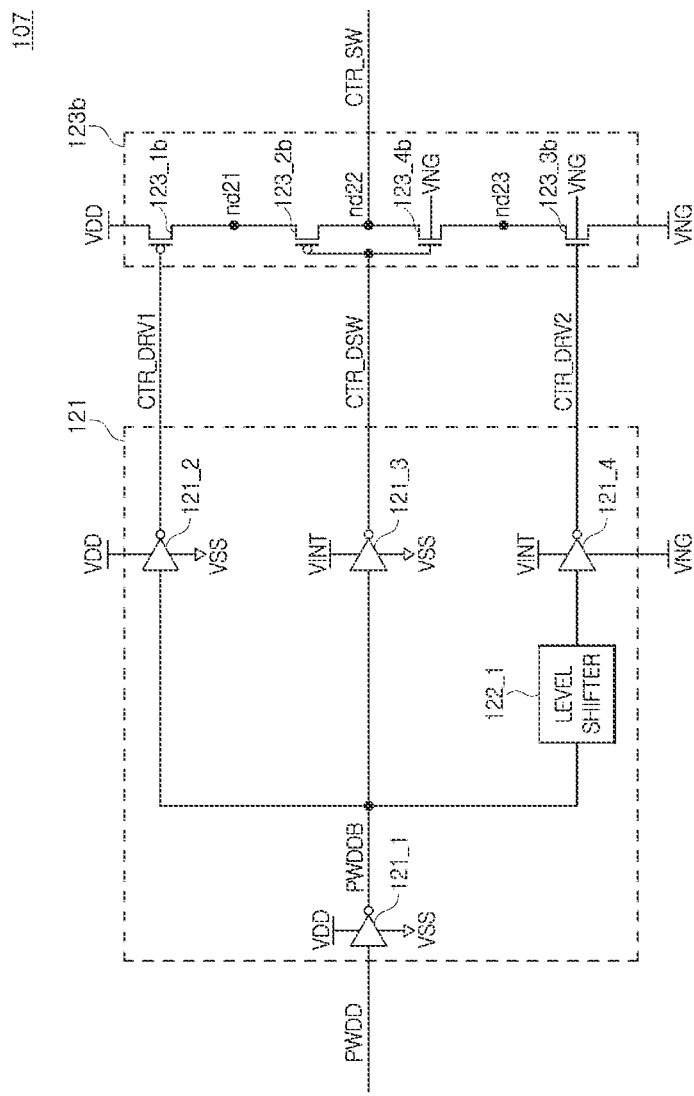
FIG. 7 is a diagram illustrating another example of the switching control signal generation circuit illustrated in FIG. 1.

FIG. 7 is a diagram illustrating another example of the switching control signal generation circuit 107 illustrated in FIG. 1. As illustrated in FIG. 7, the switching control signal generation circuit 107 may include a driving control signal generation circuit 121 and a switching control signal driving circuit 123b. Detailed description for the driving control signal generation circuit 121 is the same as that made above with reference to FIG. 3.

The switching control signal driving circuit 123b may drive the switching control signal CTR_SW by being supplied with the power supply voltage VDD and the bias voltage VNG on the basis of the first driving control signal CTR_DRV1, the second driving control signal CTR_DRV2, and the driving switching control signal CTR_DSW. The switching control signal driving circuit 123b may include a first driving element 123_1b, a first driving switching element 123_2b, a second driving element 123_3b, and a second driving switching element 123_4b. Each of the first driving element 123_1b and the first driving switching element 123_2b may be implemented using a PMOS transistor having a gate oxide layer which is formed thinner than that of 123_3a (see FIG. 3) as with 123_1a and 123_2a (see FIG. 3), in order to quickly enter the normal mode when the power-down mode is ended. Each of the second driving element 123_3b and the second driving switching element 123_4b may be implemented using an NMOS transistor having a gate oxide layer which is formed thinner than that of 123_3a (see FIG. 3), in order to quickly enter the power-down mode when the normal mode is ended.

When being turned on on the basis of the first driving control signal CTR_DRV1, the first driving element 123_1b may drive an internal node nd21 by being supplied with the power supply voltage VDD. When being turned on on the basis of the driving switching control signal CTR_DSW, the first driving switching element 123_2b may electrically couple the internal node nd21 and an output node nd22 through which the switching control signal CTR_SW is outputted. When being turned on on the basis of the second driving control signal CTR_DRV2, the second driving element 123_3b may drive an internal node nd23 by being supplied with the bias voltage VNG. When being turned on on the basis of the driving switching control signal CTR_DSW, the second driving switching element 123_4b may electrically couple the internal node nd23 and the output node nd22. A body of each of the second driving element 123_3b and the second driving switching element 123_4b may be supplied with the bias voltage VNG.

Depending on whether the power-down mode is performed, the switching control signal driving circuit 123b may drive the switching control signal CTR_SW to the power supply voltage VDD by turning on the first driving element 123_1b and the first driving switching element 123_2b, or may drive the switching control signal CTR_SW to the bias voltage VNG by turning on the second driving element 123_3b and the second driving switching element 123_4b. When the power-down mode is performed, the switching control signal driving circuit 123b may drive the switching control signal CTR_SW to the bias voltage VNG by turning on the second driving element 123_3b and the second driving switching element 123_4b on the basis of the second driving control signal CTR_DRV2 and the driving switching control signal CTR_DSW. When the power-down mode is performed, the switching control signal driving circuit 123b may turn off the first driving element 123_1b and the first driving switching element 123_2b on the basis of the first driving control signal CTR_DRV1 and the driving switching control signal CTR_DSW. When the power-down mode is ended, the switching control signal driving circuit 123b may drive the switching control signal CTR_SW to the power supply voltage VDD by turning on the first driving element 123_1b and the first driving switching element 123_2b on the basis of the first driving control signal CTR_DRV1 and the driving switching control signal CTR_DSW. When the power-down mode is ended, the switching control signal driving circuit 123b may turn off the second driving element 123_3b and the second driving switching element 123_4b on the basis of the second driving control signal CTR_DRV2 and the driving switching control signal CTR_DSW.

Figure 8:
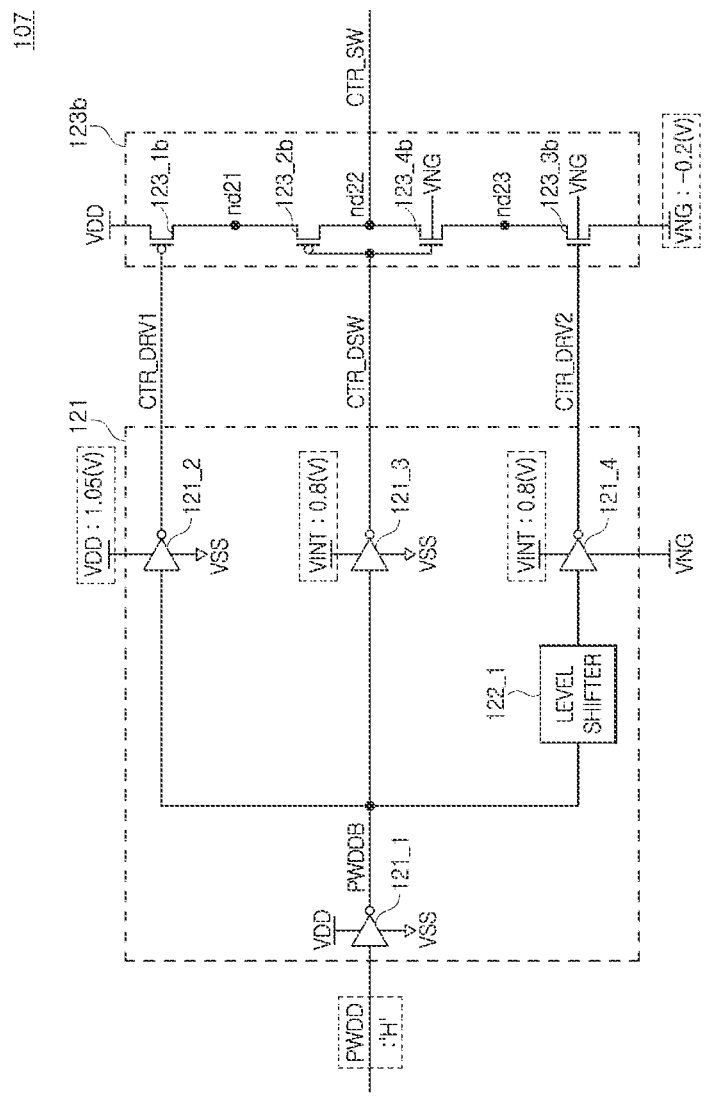
FIGS. 8 and 9 are diagrams to assist in the description of the operation of the switching control signal generation circuit illustrated in FIG. 7.

FIG. 8 is a diagram to assist in the description of an operation performed in the switching control signal generation circuit 107 illustrated in FIG. 7 when the power-down mode is performed. Referring to FIG. 2, the power supply voltage VDD, the internal voltage VINT, and the bias voltage VNG illustrated in FIG. 7 may be set to levels of 1.05(V), 0.8(V), and −0.2(V), respectively.

When the power-down mode is performed, the driving control signal generation circuit 121 may drive the first driving control signal CTR_DRV1, the driving switching control signal CTR_DSW, and the second driving control signal CTR_DRV2 to 1.05(V), 0.8(V), and 0.8(V), respectively, on the basis of the power-down period signal PWDD having a logic high level 'H.'

When the power-down mode is performed, the second driving element 123_3b and the second driving switching element 123_4b may be turned on on the basis of the second driving control signal CTR_DRV2 and the driving switching control signal CTR_DSW driven to 0.8(V) and drive the output node nd22 to −0.2(V).

When the power-down mode is performed, the first driving element 123_1b may be turned off on the basis of the first driving control signal CTR_DRV1 driven to 1.05(V). As the first driving element 123_1b is separated from the output node nd22, driven to −0.2(V), by the first driving switching element 123_2b, the degradation of the first driving element 123_1b may be alleviated (the degradation of a transistor may become serious as a voltage difference between a gate terminal and a drain terminal of the transistor increases).

Even though the output node nd22 is driven to −0.2(V), which is lower than 0(V), when the power-down mode is performed, as the first driving switching element 123_2b is turned off on the basis of the driving switching control signal CTR_DSW driven to 0.8(V), which is lower than 1.05(V), the degradation of the first driving switching element 123_2b may be alleviated.

Accordingly, in pull-down driving the switching control signal CTR_SW for a power gating operation when the power-down mode is performed, the switching control signal driving circuit 123b may be supplied with the first driving control signal CTR_DRV1 and the driving switching control signal CTR_DSW driven to different levels, which makes it possible to alleviate the degradation of the first driving element 123_1b and the first driving switching element 123_2b.

Figure 9:
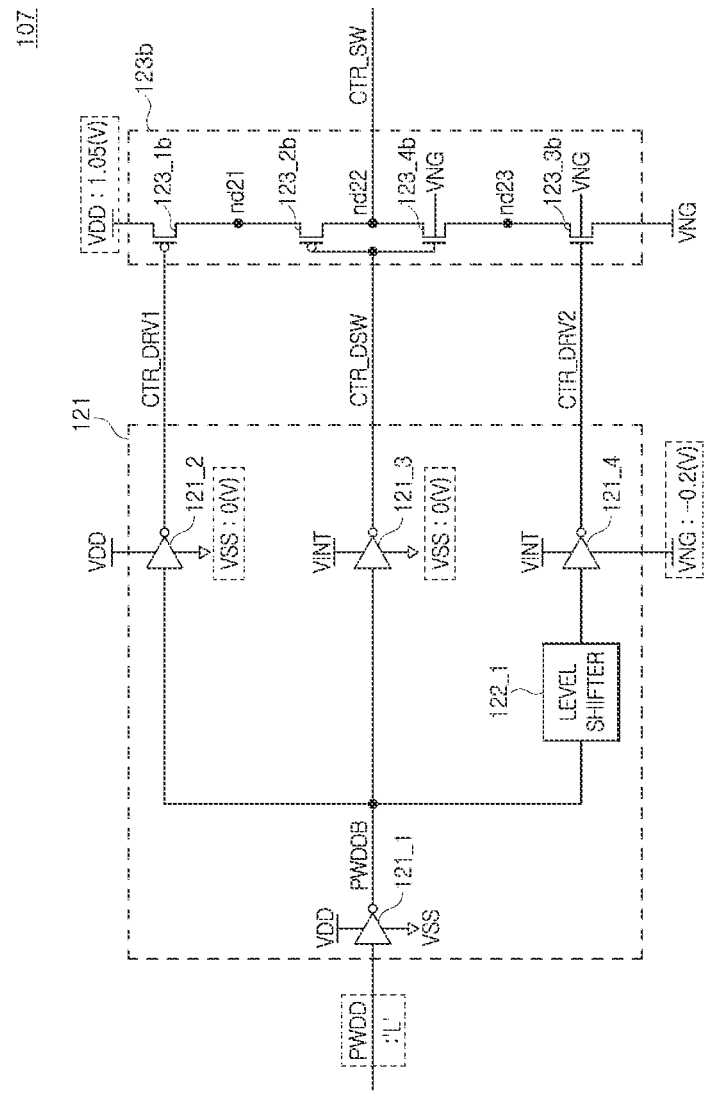

FIG. 9 is a diagram to assist in the description of an operation performed in the switching control signal generation circuit 107 illustrated in FIG. 7 when the power-down mode is ended. Referring to FIG. 2, the power supply voltage VDD, the ground voltage VSS, and the bias voltage VNG illustrated in FIG. 9 may be set to 1.05(V), 0(V), and −0.2(V), respectively.

When the power-down mode is ended, the driving control signal generation circuit 121 may drive the first driving control signal CTR_DRV1, the driving switching control signal CTR_DSW, and the second driving control signal CTR_DRV2 to 0(V), 0(V), and −0.2(V), respectively, on the basis of the power-down period signal PWDD having a logic low level 'L.'

When the power-down mode is ended, the first driving element 123_1b and the first driving switching element 123_2b may drive the output node nd22 to 1.05(V) on the basis of the first driving control signal CTR_DRV1 and the driving switching control signal CTR_DSW driven to 0(V).

When the power-down mode is ended, the second driving element 123_3b may be turned off on the basis of the second driving control signal CTR_DRV2 driven to −0.2(V). As the second driving element 123_3b is separated from the output node nd22, driven to 1.05(V), by the second driving switching element 123_4b, the degradation of the second driving element 123_3b may be alleviated.

Even though the output node nd22 is driven to 1.05(V), which is higher than 0.8(V), when the power-down mode is ended, as the second driving switching element 123_4b is turned off on the basis of the driving switching control signal CTR_DSW driven to 0(V), which is higher than −0.2(V), the degradation of the second driving switching element 123_4b may be alleviated.

Accordingly, in pull-up driving the switching control signal CTR_SW for the power gating operation when the power-down mode is ended, the switching control signal driving circuit 123b may be supplied with the second driving control signal CTR_DRV2 and the driving switching control signal CTR_DSW driven to different levels, which makes it possible to alleviate the degradation of the second driving element 123_3b and the second driving switching element 123_4b.

Figure 10:
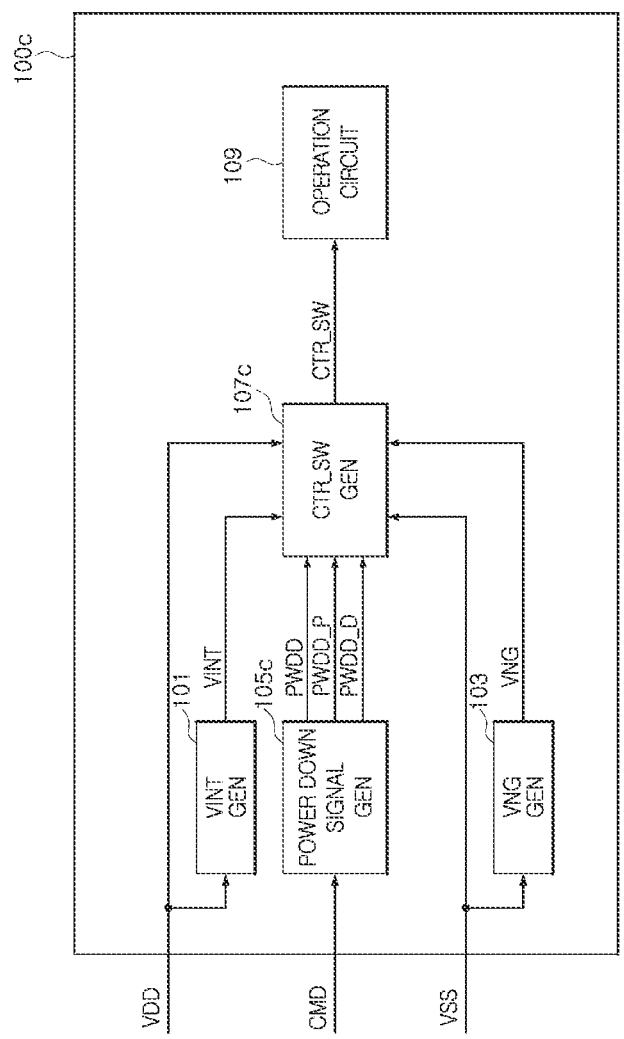
FIG. 10 is a block diagram illustrating a configuration of an electronic device in accordance with another example of the present disclosure.

FIG. 10 is a block diagram illustrating a configuration of an electronic device 100c in accordance with another example of the present disclosure. As illustrated in FIG. 10, the electronic device 100c may include an internal voltage generation circuit (VINT GEN) 101, a bias voltage generation circuit (VNG GEN) 103, a power-down signal generation circuit (POWER DOWN SIGNAL GEN) 105c, a switching control signal generation circuit (CTR_SW GEN) 107c and an internal operation circuit (OPERATION CIRCUIT) 109. Because the internal voltage generation circuit 101, the bias voltage generation circuit 103, and the internal operation circuit 109 were described above with reference to FIG. 1, description thereof will be omitted here.

The power-down signal generation circuit 105c may generate a power-down period signal PWDD, a power-down pulse PWDD_P, and a power-down delay period signal PWDD_D on the basis of a command CMD. The power-down signal generation circuit 105c may activate the power-down period signal PWDD by decoding the command CMD having a combination for performing a power-down mode. The power-down signal generation circuit 105c may deactivate the power-down period signal PWDD by decoding the command CMD having a combination for ending the power-down mode. The power-down signal generation circuit 105c may be activated during a period in which the power-down mode is performed. The power-down period signal PWDD may be deactivated during a period in which a normal mode is performed. The power-down signal generation circuit 105c may activate the power-down pulse PWDD_P during a preset period when the power-down mode is entered. The preset period may be variously set depending on an embodiment. The power-down signal generation circuit 105c may activate the power-down delay period signal PWDD_D from a time point when the preset period elapses to when the power-down mode is ended. A detailed operation of the power-down signal generation circuit 105c will be described later with reference to FIG. 11.

The switching control signal generation circuit 107c may generate a switching control signal CTR_SW by being supplied with a power supply voltage VDD, an internal voltage VINT, a ground voltage VSS, and a bias voltage VNG on the basis of the power-down period signal PWDD, the power-down pulse PWDD_P, and the power-down delay period signal PWDD_D. The switching control signal generation circuit 107c may drive the switching control signal CTR_SW to the ground voltage VSS during a period in which both the power-down period signal PWDD and the power-down pulse PWDD_P are activated. Namely, the switching control signal generation circuit 107c may drive the switching control signal CTR_SW to the ground voltage VSS during the preset period when the power-down mode is entered. The switching control signal generation circuit 107c may drive the switching control signal CTR_SW to the bias voltage VNG during a period in which the power-down delay period signal PWDD_D is activated. Namely, the switching control signal generation circuit 107c may drive the switching control signal CTR_SW to the bias voltage VNG from a time point when the preset period elapses to when the power-down mode is ended. The switching control signal generation circuit 107c may drive the switching control signal CTR_SW to the power supply voltage VDD during a period in which the power-down period signal PWDD is deactivated. When the power-down mode is entered, the switching control signal generation circuit 107c may drive the switching control signal CTR_SW from the power supply voltage VDD to the ground voltage VSS and thereafter to the bias voltage VNG, which makes it possible to reduce power consumption as compared to when the switching control signal CTR_SW is directly driven from the power supply voltage VDD to the bias voltage VNG. A detailed configuration and operation of the switching control signal generation circuit 107c will be described later with reference to FIG. 12.

Figure 11:
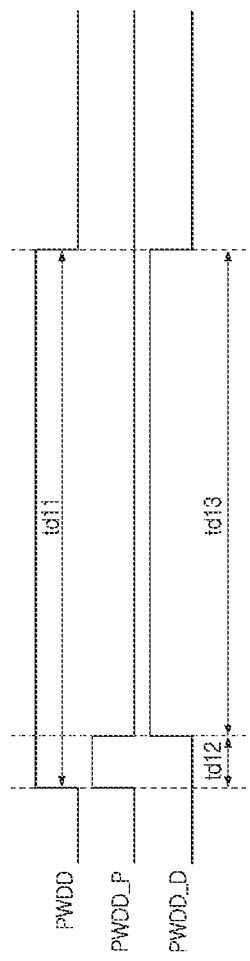
FIG. 11 is a diagram to assist in the description of the operation of a power-down signal generation circuit illustrated in FIG. 10.

FIG. 11 is a diagram to assist in the description of the operation of the power-down signal generation circuit 105c illustrated in FIG. 10. Referring to FIG. 11, the power-down signal generation circuit 105c may activate the power-down period signal PWDD during a period td11 in which the power-down mode is performed. The power-down signal generation circuit 105c may activate the power-down pulse PWDD_P during a preset period td12 when the power-down mode is entered. The power-down signal generation circuit 105c may activate the power-down delay period signal PWDD_D during a period td13 from a time point when the preset period td12 elapses to when the power-down mode is ended.

Figure 12:
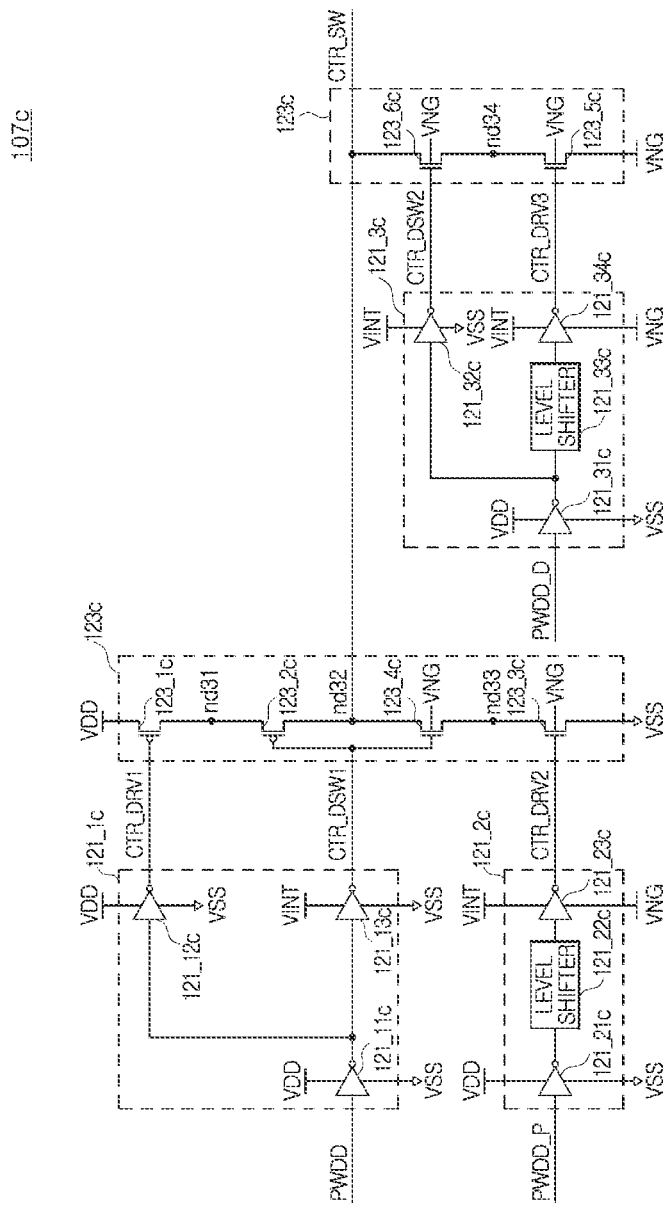
FIG. 12 is a diagram illustrating an example of a switching control signal generation circuit illustrated in FIG. 10.

FIG. 12 is a diagram illustrating an example of the switching control signal generation circuit 107c illustrated in FIG. 10. As illustrated in FIG. 12, the switching control signal generation circuit 107c may include a first driving control signal generation circuit 121_1c, a second driving control signal generation circuit 121_2c, a third driving control signal generation circuit 121_3c, and a switching control signal driving circuit 123c.

The first driving control signal generation circuit 121_1c may generate a first driving control signal CTR_DRV1 and a first driving switching control signal CTR_DSW1 by being supplied with the power supply voltage VDD, the internal voltage VINT, and the ground voltage VSS on the basis of the power-down period signal PWDD. When the power-down mode is performed, the first driving control signal generation circuit 121_1c may drive the first driving control signal CTR_DRV1 to the power supply voltage VDD and drive the first driving switching control signal CTR_DSW1 to the internal voltage VINT. That is to say, when the power-down mode is performed, the first driving control signal generation circuit 121_1c may drive the first driving control signal CTR_DRV1 and the first driving switching control signal CTR_DSW1 to different levels. When the power-down mode is ended, the first driving control signal generation circuit 121_1c may drive the first driving control signal CTR_DRV1 and the first driving switching control signal CTR_DSW1 to the ground voltage VSS. The first driving control signal generation circuit 121_1c may include first, second, and third driving circuits 121_11c, 121_12c, and 121_13c. Each of the first, second, and third driving circuits 121_11c, 121_12c, and 121_13c may be implemented using an inverter.

The second driving control signal generation circuit 121_2c may generate a second driving control signal CTR_DRV2 by being supplied with the power supply voltage VDD, the internal voltage VINT, the ground voltage VSS, and the bias voltage VNG on the basis of the power-down pulse PWDD_P. When the power-down mode is entered, the second driving control signal generation circuit 121_2c may drive the second driving control signal CTR_DRV2 to the internal voltage VINT during the preset period. When the power-down mode is entered, after the preset period, the second driving control signal generation circuit 121_2c may drive the second driving control signal CTR_DRV2 to the bias voltage VNG. The second driving control signal generation circuit 121_2c may include fourth and fifth driving circuits 121_21c and 121_23c and a level shifter 121_22c. Each of the fourth and fifth driving circuits 121_21c and 121_23c may be implemented using an inverter. The level shifter 121_22c may shift a level of a signal outputted from the fourth driving circuit 121_21c and output an output signal to an input terminal of the fifth driving circuit 121_23c. For example, the level shifter 121_22c may lower a level of a signal outputted from the fourth driving circuit 121_21c by 0.2(V) and output an output signal to the input terminal of the fifth driving circuit 121_23c.

The third driving control signal generation circuit 121_3c may generate a third driving control signal CTR_DRV3 and a second driving switching control signal CTR_DSW2 by being supplied with the power supply voltage VDD, the internal voltage VINT, the ground voltage VSS, and the bias voltage VNG on the basis of the power-down delay period signal PWDD_D. After the preset period during the power-down mode, the third driving control signal generation circuit 121_3c may drive the third driving control signal CTR_DRV3 and the second driving switching control signal CTR_DSW2 to the internal voltage VINT. When the power-down mode is ended, the third driving control signal generation circuit 121_3c may drive the third driving control signal CTR_DRV3 to the bias voltage VNG and drive the second driving switching control signal CTR_DSW2 to the ground voltage VSS. In other words, when the power-down mode is ended, the third driving control signal generation circuit 121_3c may drive the third driving control signal CTR_DRV3 and the second driving switching control signal CTR_DSW2 to different levels. The third driving control signal generation circuit 121_3c may include sixth, seventh, and eighth driving circuits 121_31c, 121_32c, and 121_34c and a level shifter 121_33c. Each of the sixth, seventh, and eighth driving circuits 121_31c, 121_32c, and 121_34c may be implemented using an inverter. The level shifter 121_33c may shift a level of a signal outputted from the sixth driving circuit 121_31c and output an output signal to an input terminal of the eighth driving circuit 121_34c. For example, the level shifter 121_33c may lower a level of a signal outputted from the sixth driving circuit 121_31c by 0.2(V) and output an output signal to the input terminal of the eighth driving circuit 121_34c.

The switching control signal driving circuit 123c may drive the switching control signal CTR_SW by being supplied with the power supply voltage VDD, the ground voltage VSS, and the bias voltage VNG on the basis of the first driving control signal CTR_DRV1, the second driving control signal CTR_DRV2, the third driving control signal CTR_DRV3, the first driving switching control signal CTR_DSW1, and the second driving switching control signal CTR_DSW2. The switching control signal driving circuit 123c may include a first driving element 123_1c, a first driving switching element 123_2c, a second driving element 123_3c, a second driving switching element 123_4c, a third driving element 123_5c, and a third driving switching element 123_6c. Each of the first driving element 123_1c and the first driving switching element 123_2c may be implemented using a PMOS transistor having a gate oxide layer which is formed thinner than that of 123_3a (see FIG. 3) as with 123_1a and 123_2a (see FIG. 3), in order to quickly enter the normal mode when the power-down mode is ended. Each of the second driving element 123_3c, the second driving switching element 123_4c, the third driving element 123_5c and the third driving switching element 123_6c may be implemented using an NMOS transistor having a gate oxide layer which is formed thinner than that of 123_3a (see FIG. 3), in order to quickly enter the power-down mode when the normal mode is ended.

When being turned on on the basis of the first driving control signal CTR_DRV1, the first driving element 123_1c may drive an internal node nd31 by being supplied with the power supply voltage VDD. When being turned on on the basis of the first driving switching control signal CTR_DSW1, the first driving switching element 123_2c may electrically couple the internal node nd31 and an output node nd32 through which the switching control signal CTR_SW is outputted. When being turned on on the basis of the second driving control signal CTR_DRV2, the second driving element 123_3c may drive an internal node nd33 by being supplied with the ground voltage VSS. When being turned on on the basis of the first driving switching control signal CTR_DSW1, the second driving switching element 123_4c may electrically couple the internal node nd33 and the output node nd32. When being turned on on the basis of the third driving control signal CTR_DRV3, the third driving element 123_5c may drive an internal node nd34 by being supplied with the bias voltage VNG. When being turned on on the basis of the second driving switching control signal CTR_DSW2, the third driving switching element 123_6c may electrically couple the internal node nd34 and the output node nd32. A body of each of the second driving element 123_3c, the second driving switching element 123_4c, the third driving element 123_5c, and the third driving switching element 123_6c may be supplied with the bias voltage VNG.

Depending on whether the power-down mode is entered, the switching control signal driving circuit 123c may drive the switching control signal CTR_SW to the power supply voltage VDD by turning on the first driving element 123_1c and the first driving switching element 123_2c, or may drive the switching control signal CTR_SW to the ground voltage VSS by turning on the second driving element 123_3c and the second driving switching element 123_4c. The switching control signal driving circuit 123c may drive the switching control signal CTR_SW to the ground voltage VSS by turning on the second driving element 123_3c and the second driving switching element 123_4c during the preset period when the power-down mode is entered, and may drive the switching control signal CTR_SW to the bias voltage VNG by turning on the third driving element 123_5c and the third driving switching element 123_6c after the preset period.

During the preset period when the power-down mode is entered, the switching control signal driving circuit 123c may drive the switching control signal CTR_SW to the ground voltage VSS by turning on the second driving element 123_3c and the second driving switching element 123_4c on the basis of the second driving control signal CTR_DRV2 and the first driving switching control signal CTR_DSW1. After the preset period during the power-down mode, the switching control signal driving circuit 123c may drive the switching control signal CTR_SW to the bias voltage VNG by turning on the third driving element 123_5c and the third driving switching element 123_6c on the basis of the third driving control signal CTR_DRV3 and the second driving switching control signal CTR_DSW2. During a period in which the power-down mode is performed, the switching control signal driving circuit 123c may turn off the first driving element 123_1c and the first driving switching element 123_2c on the basis of the first driving control signal CTR_DRV1 and the first driving switching control signal CTR_DSW1.

When the power-down mode is ended, the switching control signal driving circuit 123c may drive the switching control signal CTR_SW to the power supply voltage VDD by turning on the first driving element 123_1c and the first driving switching element 123_2c on the basis of the first driving control signal CTR_DRV1 and the first driving switching control signal CTR_DSW1. When the power-down mode is ended, the switching control signal driving circuit 123c may turn off the second driving element 123_3c and the second driving switching element 123_4c on the basis of the second driving control signal CTR_DRV2 and the first driving switching control signal CTR_DSW1. When the power-down mode is ended, the switching control signal driving circuit 123c may turn off the third driving element 123_5c and the third driving switching element 123_6c on the basis of the third driving control signal CTR_DRV3 and the second driving switching control signal CTR_DSW2.

Accordingly, when the power-down mode is entered, the switching control signal driving circuit 123c may drive the switching control signal CTR_SW from the power supply voltage VDD to the ground voltage VSS and thereafter to the bias voltage VNG, which makes it possible to reduce power consumption as compared to when the switching control signal CTR_SW is directly driven from the power supply voltage VDD to the bias voltage VNG.

Also, when pull-down driving a switching control signal for a power gating operation, the switching control signal driving circuit 123c may differently set levels of control signals which control whether to turn on a pull-up driving element and a pull-up switching element, which makes it possible to alleviate the degradation of the pull-up driving element and the pull-up switching element. In the same manner, when pull-up driving the switching control signal for the power gating operation, the switching control signal driving circuit 123c may differently set levels of control signals which control whether to turn on a pull-down driving element and a pull-down switching element, which makes it possible to alleviate the degradation of the pull-down driving element and the pull-down switching element.

Although some embodiments of the present teachings have been disclosed for illustrative purposes, those skilled in the art will appreciate that various modifications, additions, and/or substitutions are possible, without departing from the scope and spirit of the present teachings as defined by the accompanying claims.

What is claimed is:

1. An electronic device comprising:
   a driving control signal generation circuit configured to generate first and second driving control signals and a driving switching control signal; and
   a switching control signal driving circuit configured to drive a switching control signal to a first voltage on the basis of the first driving control signal and the driving switching control signal or drive the switching control signal to a second voltage on the basis of the second driving control signal, depending on whether a power-down mode is performed,
   wherein the first driving control signal and the driving switching control signal are driven to different levels when the power-down mode is performed, and
   wherein the driving control signal generation circuit is configured to drive the first driving control signal to the first voltage and drive the driving switching control signal to a third voltage when the power-down mode is performed and the third voltage is set as a positive voltage having a level which is lower than a level of the first voltage.

2. The electronic device according to claim 1,
   wherein the switching control signal driving circuit is configured to drive the switching control signal to the second voltage when the power-down mode is performed and the second voltage is set as a negative voltage.

3. The electronic device according to claim 1,
   wherein the switching control signal driving circuit is configured to drive the switching control signal to the first voltage when the power-down mode has ended and the first voltage is set as a positive voltage.

4. The electronic device according to claim 1, wherein the driving control signal generation circuit is configured to drive the second driving control signal to the third voltage when the power-down mode is performed.

5. The electronic device according to claim 1, wherein the switching control signal driving circuit comprises:
   a first driving element configured to drive an internal node by being supplied with the first voltage on the basis of the first driving control signal;
   a driving switching element configured to electrically couple the internal node and an output node through which the switching control signal is outputted, on the basis of the driving switching control signal; and
   a second driving element configured to drive the output node by being supplied with the second voltage on the basis of the second driving control signal.

6. The electronic device according to claim 5,
   wherein each of the first driving element and the driving switching element is implemented using a PMOS transistor, and
   wherein the second driving element is implemented using an NMOS transistor.

7. The electronic device according to claim 5,
   wherein, when the power-down mode is performed, the switching control signal driving circuit is configured to drive the output node to the second voltage by turning on the second driving element on the basis of the second driving control signal and turn off the first driving element and the driving switching element on the basis of the first driving control signal and the driving switching control signal.

8. The electronic device according to claim 5,
wherein, when the power-down mode has ended, the switching control signal driving circuit is configured to drive the output node to the first voltage by turning on the first driving element and the driving switching element on the basis of the first driving control signal and the driving switching control signal and turn off the second driving element on the basis of the second driving control signal.

9. The electronic device according to claim 5,
wherein the second driving element has a gate oxide layer which is formed to be thicker than gate oxide layers of the first driving element and the driving switching element.

10. The electronic device according to claim 1, further comprising:
an internal operation circuit configured to be cut off from supplied power on the basis of the switching control signal when the power-down mode is performed.

11. The electronic device according to claim 10, wherein the internal operation circuit comprises:
a logic circuit coupled between a power line and a virtual ground line; and
a switching element implemented using an NMOS transistor which is coupled between the virtual ground line and a ground line,
wherein the switching element controls supply of a ground voltage to the logic circuit on the basis of the switching control signal.

12. An electronic device comprising:
a driving control signal generation circuit configured to generate first and second driving control signals and a driving switching control signal; and
a switching control signal driving circuit configured to drive a switching control signal to a first voltage on the basis of the first driving control signal and the driving switching control signal or drive the switching control signal to a second voltage on the basis of the second driving control signal and the driving switching control signal, depending on whether a power-down mode is performed,
wherein the first driving control signal and the driving switching control signal are driven to different levels when the power-down mode is performed, and
wherein the driving control signal generation circuit is configured to drive the first driving control signal to the first voltage and drive the driving switching control signal to a third voltage when the power-down mode is performed and the third voltage is set as a positive voltage having a level which is lower than a level of the first voltage.

13. The electronic device according to claim 12,
wherein the driving control signal generation circuit is configured to drive the second driving control signal and the driving switching control signal to different levels when the power-down mode is ended.

14. The electronic device according to claim 12, wherein the switching control signal driving circuit comprises:
a first driving element configured to drive a first internal node by being supplied with the first voltage on the basis of the first driving control signal;
a first driving switching element configured to electrically couple the first internal node and an output node through which the switching control signal is outputted, on the basis of the driving switching control signal;
a second driving element configured to drive a second internal node by being supplied with the second voltage on the basis of the second driving control signal; and
a second driving switching element configured to electrically couple the second internal node and the output node on the basis of the driving switching control signal.

15. The electronic device according to claim 13,
wherein each of the first driving element and the first driving switching element is implemented using a PMOS transistor, and
wherein each of the second driving element and the second driving switching element is implemented using an NMOS transistor.

16. An electronic device comprising:
a first driving control signal generation circuit configured to generate a first driving control signal and a first driving switching control signal;
a second driving control signal generation circuit configured to generate a second driving control signal; and
a switching control signal driving circuit configured to drive a switching control signal to a first voltage on the basis of the first driving control signal and the first driving switching control signal or drive the switching control signal to a ground voltage on the basis of the second driving control signal and the first driving switching control signal, depending on whether a power-down mode is entered,
wherein the first driving control signal and the first driving switching control signal are driven to different levels when the power-down mode is performed, and
wherein the first driving control signal generation circuit is configured to drive the first driving control signal to the first voltage and drive the first driving switching control signal to a third voltage when the power-down mode is performed and the third voltage is set as a positive voltage having a level is lower than a level of the first voltage.

17. The electronic device according to claim 16,
wherein the switching control signal driving circuit is configured to drive the switching control signal to the ground voltage on the basis of the second driving control signal and the first driving switching control signal during a preset period when the power-down mode is entered, and is configured to drive the switching control signal to a second voltage on the basis of a third driving control signal and a second driving switching control signal after the preset period, the second voltage being set as a negative voltage.

18. The electronic device according to claim 17, wherein the switching control signal driving circuit comprises:
a first driving element configured to drive a first internal node by being supplied with the first voltage on the basis of the first driving control signal;
a first driving switching element configured to electrically couple the first internal node and an output node through which the switching control signal is outputted, on the basis of the first driving switching control signal;
a second driving element configured to drive a second internal node by being supplied with the ground voltage on the basis of the second driving control signal;

a second driving switching element configured to electrically couple the second internal node and the output node on the basis of the first driving switching control signal;

a third driving element configured to drive a third internal node by being supplied with the second voltage on the basis of the third driving control signal; and a third driving switching element configured to electrically couple the third internal node and the output node on the basis of the second driving switching control signal.

19. The electronic device according to claim 18, wherein each of the first driving element and the first driving switching element is implemented using a PMOS transistor, and wherein each of the second driving element, the second driving switching element, the third driving element and the third driving switching element is implemented using an NMOS transistor.

\* \* \* \* \*